United States Patent [19]

Thakoor

[11] Patent Number: 5,196,101
[45] Date of Patent: Mar. 23, 1993

[54] DEPOSITION OF THIN FILMS OF MULTICOMPONENT MATERIALS

[75] Inventor: Sarita Thakoor, Pasadena, Calif.

[73] Assignee: Califoria Institute of Technology, Pasadena, Calif.

[21] Appl. No.: 651,329

[22] Filed: Feb. 5, 1991

[51] Int. Cl.$^5$ .............................................. C23C 14/34
[52] U.S. Cl. ........................ 204/192.26; 204/192.18; 204/192.15
[58] Field of Search ....................... 204/192.12, 192.15, 204/192.18, 192.22, 192.26, 298.23, 298.28

[56] References Cited

U.S. PATENT DOCUMENTS

| 4,640,755 | 2/1987 | Sato | 204/192.2 |
|---|---|---|---|
| 4,647,361 | 3/1987 | Bauer | 204/298.26 X |
| 4,731,172 | 3/1988 | Adachin et al. | 204/192.15 X |
| 4,793,908 | 12/1988 | Scott et al. | 204/192.15 X |
| 4,929,320 | 5/1990 | Yamada et al. | 204/192.15 X |
| 4,938,858 | 7/1990 | Zejda | 204/192.12 X |
| 4,952,295 | 8/1990 | Kawabata et al. | 204/192.15 |

OTHER PUBLICATIONS

Screenivas et al., "Charaterization ... targets", J. Appl. Phys. 64(3), Aug. 1988, pp. 1484-1493.

*Primary Examiner*—Nam Nguyen
*Attorney, Agent, or Firm*—Benman and Collins

[57] ABSTRACT

Composite films of multicomponent materials, such as oxides and nitrides, e.g., lead zirconate titanate, are deposited by dc magnetron sputtering, employing a rotating substrate holder, which rotates relative to a plurality of targets, one target for each metal element of the multicomponent material. The sputtering is carried out in a reactive atmosphere. The substrates on which the layers are deposited are at ambient temperature. Following deposition of the composite film, the film is heated to a temperature sufficient to initiate a solid state reaction and form the final product, which is substantially single phase and substantially homogeneous.

24 Claims, 3 Drawing Sheets

DEPOSITION OF THIN FILMS OF MULTICOMPONENT MATERIALS

ORIGIN OF THE INVENTION

The invention described herein was made in the performance of work under a NASA contract, and is subject to the provisions of Public Law 96-517 (35 U.S.C. 202) in which the Contractor has elected to retain title.

TECHNICAL FIELD

The present invention relates to multicomponent oxides, and, more particularly, to the deposition of thin films of such materials at ambient substrate temperatures.

BACKGROUND ART

High substrate temperatures are required to deposit ferroelectric and piezoelectric films of materials such as lead zirconate titanate (PZT) and related derivatives. Such high temperatures prevent the use of conventional photolithography for defining elements of devices.

For example, films of such materials are deposited at high substrate temperatures (by "high" is meant >400° C.) from ceramic or powder pressed targets of the material, such as PZT, using rf magnetron sputtering or ion beam deposition. DC reactive magnetron sputtering is one of the suitable techniques for deposition of such materials with stringent composition/microstructure requirements. Reactive magnetron sputtering offers an excellent control over the rates and pressure of reactants taking part in the reaction, and thereby stoichiometry of the end product. Moreover, the low sputtering gas pressures used in the process enables one to control the film microstructure, purity, and stress density in the films; and absence of the secondary electron bombardment of the substrates allows independent control of the substrate temperature, a critical parameter in the deposition of such multicomponent materials. In addition, due to the high kinetic energy bombardment processes involved in sputter deposition, it is particularly suitable for depositing metastable phases as relatively low temperatures.

Recently, dc magnetron sputtering of a multicomponent target has been used to obtain films of PZT at a substrate temperature of 200° C. with a post-deposition annealing of 550° C. Also, there has been some effort to use a specially designed chamber, with multiple metal targets arranged in an inclined manner, to deposit on a centrally located substrate at elevated temperatures. However, such a chamber needs special designing. Furthermore, the deposition results in unavoidable composition gradients across the film.

Sol-gel techniques, which employs a low temperature process, have been used to deposit thin films of multicomponent oxides. However, in sol-gel deposition, only very thin films ($\approx 500$ Å) can be spun at a time to avoid microcracks. Hence, the film needs to be built up gradually in steps with intermediate anneals, thus necessitating considerable processing time. Further, the intermittent nature of the growth makes lift-off patterning very cumbersome.

A need remains for the deposition of multicomponent oxide films at ambient substrate temperature.

STATEMENT OF THE INVENTION

Accordingly, it is an object of the invention to provide a process for depositing uniform films of multicomponent oxides at ambient substrate temperatures.

It is another object of the invention to provide enhanced control over the film composition.

It is yet another object of the invention to provide closer control of solid state reactions during post-deposition annealing, because each metal layer in the deposited multilayer stack can be effectively extremely thin (even a fraction of a monolayer).

In accordance with the invention, a process is provided for the deposition of thin films of multicomponent oxides. The process utilizes multi-target dc reactive magnetron sequential sputtering of the component metals on a rotating substrate holder in a reactive noble gas/oxygen or nitrogen ambient. Heating of the substrates in vacuum during deposition, contrary to the prior art, is not required by the process of the invention. Individual control of each metal, down to a monolayer thickness, is obtained, as the sputtering powers can be individually controlled and the substrate rotation rate controls the individual monolayer thickness. The technique of the invention thus provides enhanced control over the composition of the deposited film.

A subsequent post-deposition anneal as low as 450° C. is sufficient to initiate the solid state reaction within the deposited multicomponent film, leading to the formation of, for example, ferroelectric PZT films. This separation of the deposition process (at ambient temperature) from the sintering step makes this technique readily compatible to conventional patterning techniques. The process of the invention is easily extendable to deposition of other multicomponent materials, including oxides and nitrides.

The novel features of the process of the invention are:

1. deposition of uniform films at ambient substrate temperature, obviating the need to heat the substrates in a vacuum;

2. enhanced control over film composition, since sputtering of each metal is individually controlled; and 3. closer control of solid state reactions during post-deposition annealing because each metal layer in the deposited multilayer stack is extremely thin.

The low temperature process of the invention is preferable over the low temperature technique of sol-gel for two reasons. First, there is no limitation on the thickness of the film obtained employing the sputtering process of the invention. Second, lift-off patterning of the sample can be very conveniently done in the sputtering technique, since no heating is involved during deposition. The thin films so formed by the process of the invention are substantially single phase and substantially homogeneous.

DETAILED DESCRIPTION OF THE INVENTION

The process which follows is described in terms of fabricating a particular oxide, which has ferroelectric properties: lead zirconate titanate. However, it will be appreciated that the process of the invention is useful for the fabrication of other oxides, as well as nitrides. The process of the invention is expected to find use in preparing such ceramic materials for uses in ferroelectric and superconducting applications, where precise control of composition and thickness is critical.

In contrast to the prior art processes, the process of the invention instead utilizes multitarget dc reactive magnetron sequential sputtering of the component metals on a rotating substrate holder in a reactive noble gas/oxygen ambient to form oxides (a reactive noble gas/nitrogen ambient is used to form nitrides).

Heating of the substrates in vacuum during deposition is not required in the process of the invention. Individual control of each metal, down to a monolayer thickness is obtained, as the sputtering powers can be individually controlled, and the substrate rotation rate controls the individual monolayer thickness.

The process of the invention thus provided enhanced control over the composition of the deposited film. A subsequent post-deposition anneal as low as about 450° C. is sufficient to initiate the solid state reaction within the deposited multicomponent film, leading to the formation of ferroelectric PZT films. However, a temperature of at least about 500° C. is required in order to achieve substantially complete reaction; the reaction takes about 4 to 5 hours to completion. Preferably, a temperature of at least about 525° C. is employed, since substantially homogeneous layers are obtained within a heating time of about 2 to 3 hours.

This separation of the deposition process (at ambient temperature) from the sintering step makes this technique readily compatible to conventional patterning techniques. The process of the invention is easily extendable to deposition of other multicomponent oxides and nitrides.

Figure 1A:
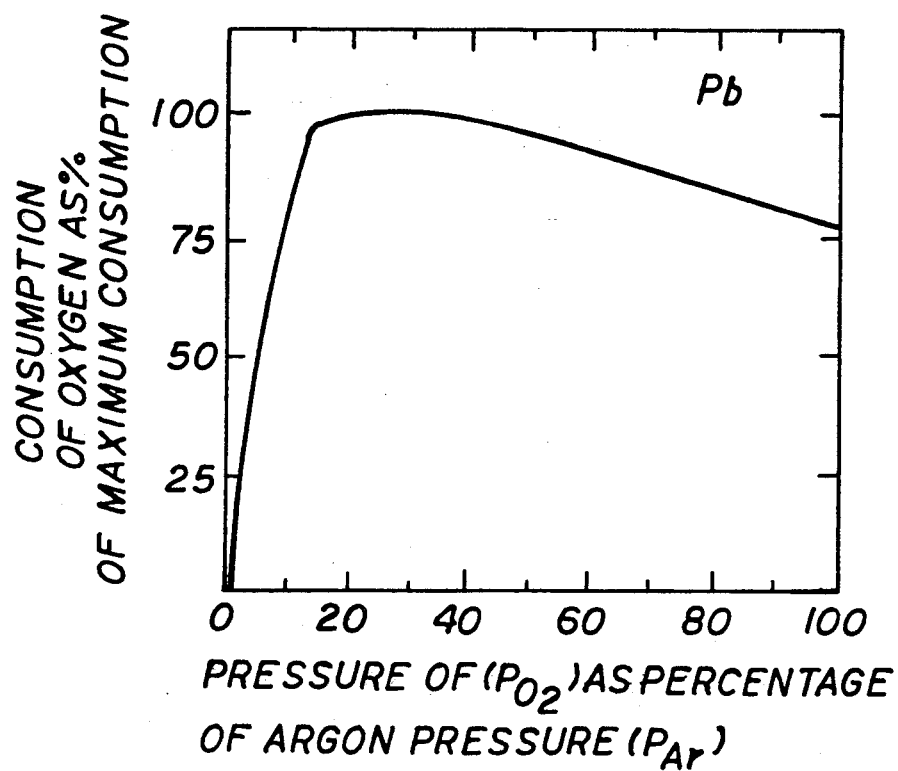
FIG. 1a, on coordinates of consumption of oxygen as a percent of maximum consumption versus the partial pressure of oxygen as a percent of the partial pressure of argon, is a plot of the oxygen consumption characteristics during reactive sputter deposition of $Pb_xO_y$.
Figure 1B:
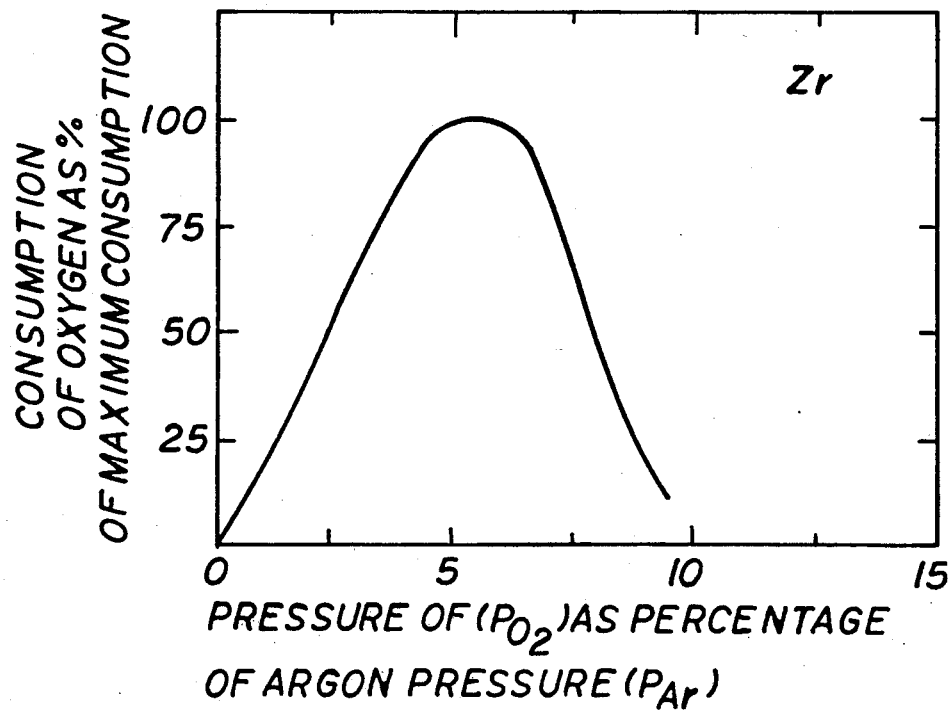
FIG. 1b, on similar coordinates as FIG. 1a, is a plot of the oxygen consumption characteristics during reactive sputter deposition of $Zr_xO_y$.

The choice of the specific value for the background noble gas (e.g., argon, helium, neon, krypton) pressure influences the flux, incidence angle, and kinetic energy of the deposited atoms incident onto the substrate, thereby affecting the grain size, stoichiometry, and density of voids in the resulting deposit. To maintain the operation in the desired magnetron domain, the background inert gas pressure could range from about 1 mTorr to tens of mTorr pressure. For the specific conditions discussed below, argon was selected as the inert gas. The reactive gas ($O_2$) consumption-injection characteristics for each metal target were studied to determine the optimum reactive gas injection pressure; maximum consumption indicated the most efficient oxide formation point. Metals such as lead that form a conductive oxide can be sputtered over a wide range of oxygen content, as indicated by FIG. 1a. Metals such as zirconium have a relatively narrow range of oxygen injection pressure, as seen in FIG. 1b, for which they yield maximum consumption and then they slowly get poisoned due to the non-conducting oxide formation.

Figure 1C:
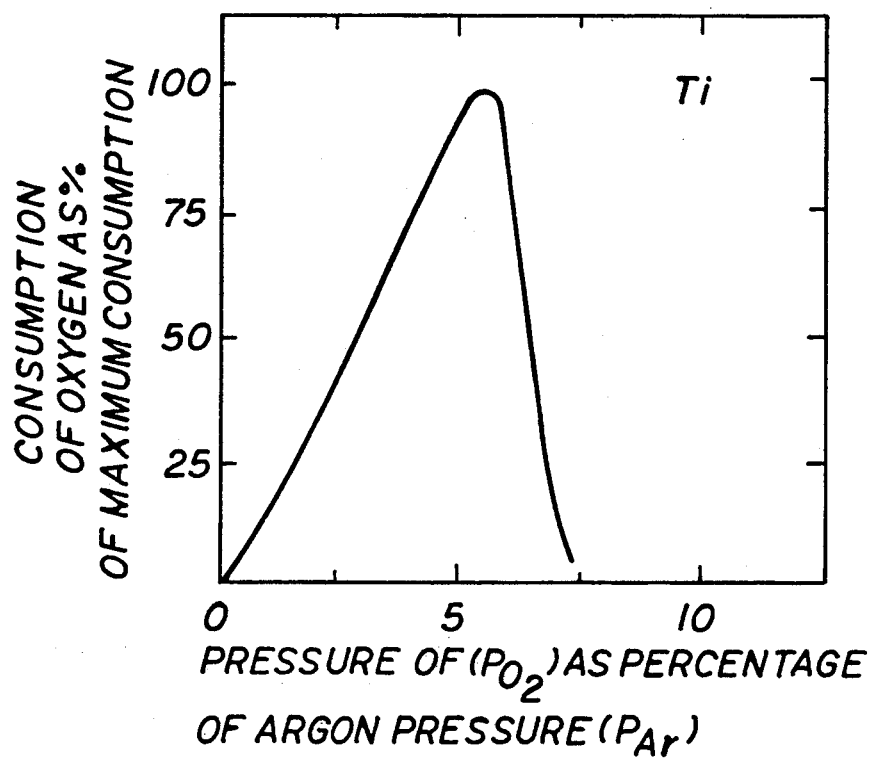
FIG. 1c, on similar coordinates as FIG. 1a, is a plot of the oxygen consumption characteristics during reactive sputter deposition of $Ti_xO_y$.

However, the limit of the reactive gas pressure is set by metals such as titanium that undergo a sharp poisoning (as shown in FIG. 1c) with formation of the first few monolayers of the non-conducting oxides. Titanium is most sensitive to poisoning by oxygen; hence, the sputtering partial pressure for oxygen is governed by the optimum value required for titanium. Such considerations dictate the sputtering of other multicomponent systems, and an analysis of each component is done, as above, to determine the optimum value for the system.

An oxygen pressure of about 5 to 6% of the background argon pressure is therefore preferably employed for the PZT deposition. For other multicomponent systems, it will be evident to the person skilled in the art that, based on the foregoing considerations, a different oxygen pressure might be employed.

Since the sputtering yield for lead (1.26) is about four times higher than that for zirconium (0.38) and titanium (0.33), minimal sputtering power is used for lead. The sputtering yields were obtained from K. Sreenivas and M. Sayer, *Journal of Applied Physics,* Vol. 64, No. 3, pp. 1484–1493 (1988).

The crucial aspect of this invention is to obtain controlled amount of successive deposition of the constituents, e.g., Pb, Zr, Ti, of the desired multicomponent oxide or nitride so as to ensure an optimally enhanced solid state reaction in the following sintering step leading to formation of homogeneous, single phase resultant multicomponent material. This control is conveniently obtained by using a rotating substrate holder. For a given geometry of the deposition chamber, the angular window for deposition of each constituent material is governed by the respective angular deposition aperture and size of target. The revolutions per minute (rpm) determine the time window for each constituent deposition.

The faster the rotation, the fewer number of monolayers (or thinner layer) of the individual metal is formed in the layered deposit. This leads to closer control on the solid state composite phase forming reactions. Consistent with this consideration, a rotation rate of about 30 to 40 rpm is desirably employed. Below a rotation rate of about 30 rpm, the layers are too thick, and solid state reaction is impeded. Greater than about 40 rpm may be used, governed by the mechanical strength constraints of a given geometry system.

The thickness of the films deposited by the process of the invention appears to be unlimited. While films of 2,000 to 3,000 Å thick have been grown for device applications, it appears that films approaching 1 $\mu$m and more may also be grown by this technique.

Multicomponent materials, as phase diagrams will immediately suggest, can have several different crystalline phases occurring at different stoichiometries of the constituents. Each such phase with specific stoichiometry could lead to material with specific properties and thereby specific applications. The process of the invention provides the ability to tailor-make to order such specific phase with associated specific stoichiometry for the desired application.

EXAMPLES

A. Experimental Details

Figure 2:
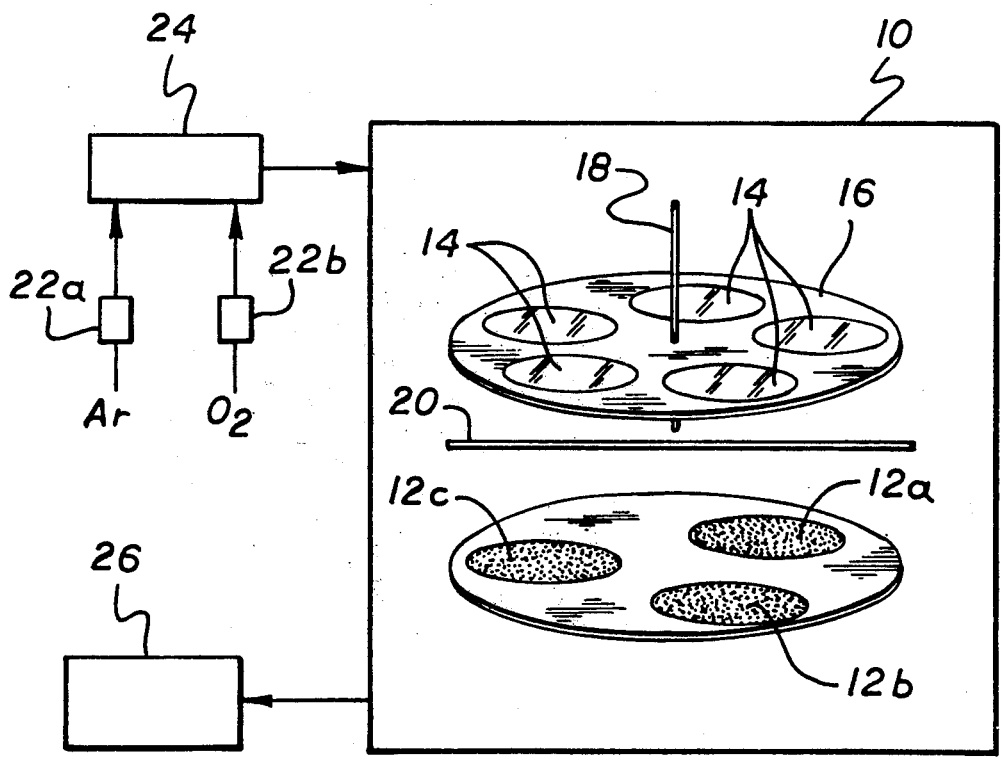
FIG. 2 is a schematic diagram of the apparatus used for depositing thin films of multicomponent oxides in accordance with the invention.

A vacuum chamber 10 was equipped with three planar magnetron sputtering targets 12 (U.S. Inc.) arranged symmetrically 120° apart, radially around the central axis, as shown schematically in FIG. 2. Metallic targets, 2-in. diameter, 0.125-in. thick and 99.99% pure of lead (12a), zirconium (12b), and titanium (12c) were used for sequential sputtering on at least one substrate 14 rotating on a substrate holder 16 about the central axis 18 of the chamber. A rotatable shutter 20 was provided to permit deposition from the targets 12 onto the substrate(s) 14.

A variety of substrates, including borosilicate glass, quartz, indium tin oxide (ITO) glass, sapphire, and passivated silicon were used for the deposition. No intentional substrate heating was employed. The temperature of the substrates during deposition was monitored using a thermocouple and was observed to stay below 60° C.

The sputtering was carried out in a reactive gas mixture of high purity (99.999%) argon (inert gas) and oxygen (reactive gas). The flow rates of Ar and $O_2$ were independently controlled by their respective flowmeters 22a, 22b, respectively, through a mixing chamber 24 prior to entry into the chamber 10. Vacuum means 26 were used to pull a vacuum of the requisite pressure; such means may include a roughing mechanical pump, a turbo pump, an ion pump, and the like to achieve the desired vacuum. Since these are well-known in this art, they are not depicted in FIG. 2, other than by the reference numeral 26.

The deposition routine typically consisted of setting up the argon ambient and pre-sputtering the targets, with the shutter 20 in place (between the targets 12 and the substrates 14), to clean the surfaces. Next, oxygen was added and the ambient stabilized. The target powers were set and the targets 12 conditioned for a period of time. Following this, the shutter 20 was removed and deposition onto the rotating substrates 14 was initiated.

An example of the deposition conditions for obtaining films exhibiting the rhombohedral structure is summarized as follows.

background argon pressure, $P_{Ar}$=8.0 to 8.5 mTorr
sputtering pressure, $P_{Ar}+P_{O2}$=8.4 to 9.0 mTorr
titanium sputter power=60 to 75 watts
titanium sputter current=0.3 to 0.35 Amps
zirconium sputter power=20 to 30 watts
zirconium sputter current=0.15 to 0.2 Amps
lead sputter power=4.0 watts
lead sputter current=0.05 Amps
substrate to target distance=11.4 cm
substrate rotation rate=30 to 40 rpm
deposition rates=100 to 120 Å/min.

The composite film so obtained was baked in an open air furnace at 550° C. for ½ hr or at 525° C. for 2 hrs after attaining steady temperature to yield the ferroelectric rhombohedral phase.

B. Results

Figure 3:
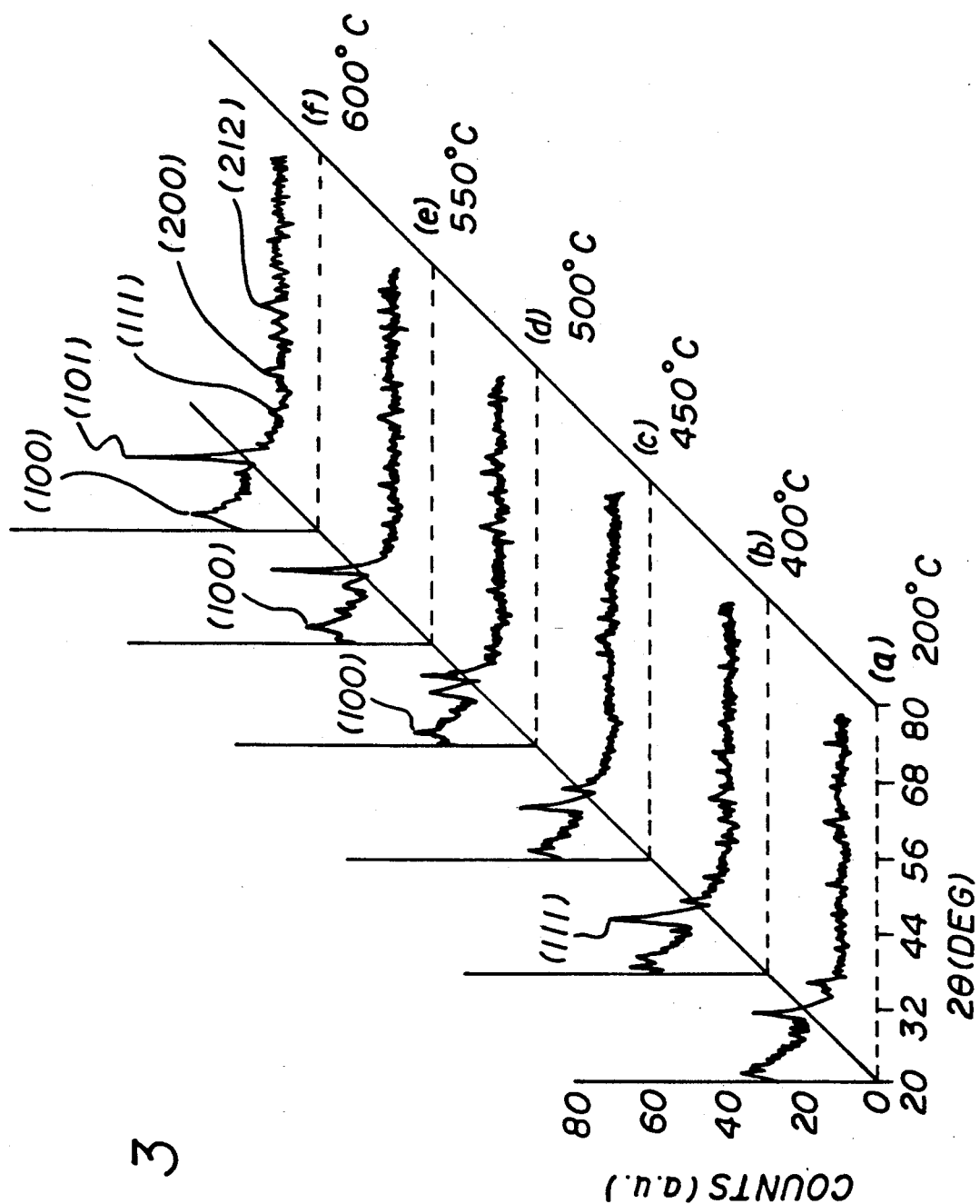
FIGS. 3a-f, on coordinates of relative intensity and degrees ($2\theta$), are plots of the X-ray diffraction patterns from a PZT film annealed in air at different temperatures (200° to 600° C.), illustrating the change in structure from body-centered-cubic (predominantly lead structure) (200° C.) to rhombohedral (homogeneous lead zirconate titanate) (600° C.).

FIG. 3 shows the X-ray diffraction patterns of a PZT thin film, mounted on the hot stage of a Siemens Allis D-500 diffractometer taken progressively at temperatures from 200° to 600° C., being held steady for 10 minutes at each temperature. The X-ray diffraction study was performed in reflection mode using Cu $K\alpha$ radiation. As deposited, the film exhibited predominantly the lead structure (body-centered-cubic); the X-ray pattern at 200° C. still showed predominantly all the lead lines (FIG. 3a). However, at about 400° C., the solid state reaction leading to formation of the lead oxides was initiated, as indicated, by the appearance of the (111) line at ≈3.08 Å (FIG. 3b). At 450° C., the PZT composite formation initiates, as is indicated by the emergence of the (100) PZT rhombohedral line. At about 500° C., the thin film is mainly PZT, with very little unreacted PbO remaining, as evidenced by the disappearance of all PbO weak lines, the appearance of other identifying PZT lines, such as (200) and (101), and the strengthening of the (100) line. Reference is also made to Table I, below.

Illustrated in this Figure are the results of crystal structure obtained by giving a 10 min bake treatment at the desired bake temperature; in so doing, the reaction is seen to be complete at about 600° C. However, the same completion is also achieved by maintaining the film at a lower temperature for a longer time, for example, 550° C. for ½ hour completes the reaction and 525° C. for 2 to 3 hours also completes the reaction, in each case to produce homogeneous rhombohedral phase PZT.

TABLE I

Comparison of Standard (A) and Observed (B)
d Spacing Values and Relative Intensity (I)
of Lead Zirconate Titanate (PZT) Films.

A. Standard d Values (Å)

| Pb | | PbO | | PZT (rhombohedral) | |
|---|---|---|---|---|---|
| d,(hkl) | I | d,(hkl) | I | d,(hkl) | I |
| | | | | 4.07(100) | M |
| | | 3.16(111) | 100 | | |
| 2.855(111) | 100 | 2.74(200) | 80 | 2.84(101) | VS |
| 2.475(200) | 50 | — | | — | |
| | | | | 2.34(111) | W |
| | | 1.934(220) | 65 | 2.06(200) | M |
| | | — | | 1.84(102) | VW |
| 1.75(220) | 31 | — | | | |
| | | 1.649(311) | 70 | 1.68(212) | M |
| 1.49(311) | 32 | | | | |
| 1.43(222) | 9 | | | | |
| 1.136(331) | 10 | | | | |

B. Observed X-Ray Diffraction Pattern d Values (Å) and Relative Intensity (I)

| 200° C. | | 400° C. | | 450° C. | | 500° C. | | 550° C. | | 600° C. | |
|---|---|---|---|---|---|---|---|---|---|---|---|
| d | I | d | I | d | I | d | I | d | I | d | I |
| | | | | 3.93 | W | 3.93 | M | 3.99 | M | 3.98 | M |
| | | 3.08 | S | 3.06 | S | 3.06 | M | 3.04 | W | | |
| 2.84 | S | 2.78 | M | 2.79 | M | 2.83 | S | 2.82 | S | 2.82 | S |
| 2.45 | M | 2.47 | W | 2.46 | W | | | | | | |
| | | | | | | | | 2.31 | M | 2.30 | M |
| | | | | | | 2.00 | W | 2.00 | M | 2.00 | M |
| | | 1.85 | W | | | | | | | | |
| 1.74 | W | | | | | | | | | | |
| | | | | 1.64 | W | 1.64 | W | 1.64 | W | 1.64 | W |
| 1.49 | W | | | | | | | | | | |

Note:
VS = very strong,
S = strong,
M = medium,
VW = very weak,
W = weak

Surface Morphology.

The angle of incidence of the sputter deposit was a very critical parameter in determining the morphology and physical characteristics of the films. For example, where all angles of deposition were allowed, the resulting film was observed under scanning electron microscope to be rough, opaque, and of ceramic quality. By placing a collimator (not shown) around each sputtering target to restrict the deposition to a substantially perpendicular incidence, transparent electro-optic quality films were obtained.

What is claimed is:

1. A process for depositing thin films of multicomponent oxides and nitrides comprising:
    (a) providing a plurality of sputtering targets laterally spaced apart from each other and disposed substantially symmetrically about an axis and generally defining a first plane, each target corresponding to one element of said multicomponent material, each target independently controllable;
    (b) providing at least one substrate, defining a second plane spaced apart from said first plane and substantially parallel thereto;
    (c) continuously rotating said at least one substrate relative to said plurality of targets;
    (d) sequentially depositing a plurality of layers on said at least one substrate by independent, controlled reactive magnetron sputtering from each said target in a reactive atmosphere to form a composite film, said reactive atmosphere consisting essentially of a mixture of an inert gas and a reactive gas selected from the group consisting of oxygen and nitrogen; and
    (e) heating said composite film to a temperature sufficient to initiate a solid state reaction to form a substantially single phase, homogeneous multicomponent material selected from the group consisting of oxides and nitrides.

2. The process of claim 1 wherein said substrate is at ambient temperature.

3. The process of claim 1 wherein said inert gas is selected from the group consisting of argon, helium, neon, and krypton.

4. The process of claim 1 wherein each said target is collimated to provide a substantially perpendicular deposition.

5. The process of claim 1 wherein said at least one substrate is rotated about said axis at a rate of at least 30 rpm.

6. A process for depositing thin films of multicomponent oxides comprising:
    (a) providing a plurality of sputtering targets laterally spaced apart from each other and generally defining a first plane, each target corresponding to one non-oxide element of said multi-component oxide and independently controllable;
    (b) providing at least one substrate, defining a second plane spaced apart from said first plane and substantially parallel thereto;
    (c) continuously rotating said at least one substrate relative to said plurality of targets;
    (d) sequentially depositing a plurality of layers on said at least one substrate by independent, controlled reactive magnetron sputtering from each said target in a reactive atmosphere to form a composite film, said reactive atmosphere consisting essentially of an inert gas and oxygen; and
    (e) heating said composite film to a temperature sufficient to initiate a solid state reaction to form a substantially single phase, homogeneous multicomponent oxide.

7. The process of claim 6 wherein said substrate is at ambient temperature.

8. The process of claim 6 wherein said inert gas is selected from the group consisting of argon, helium, neon, and krypton.

9. The process of claim 6 wherein each said target is collimated to provide a substantially perpendicular deposition.

10. The process of claim 6 wherein said at least one substrate is rotated about said axis at a rate of at least 30 rpm.

11. A process for depositing thin films of lead zirconate titanate comprising:
    (a) providing a plurality of sputtering targets, one target each of lead, zirconium, and titanium, said targets laterally spaced apart from each other and disposed substantially symmetrically about an axis and generally defining a first plane, each target independently controllable;
    (b) providing at least one substrate, defining a second plane spaced apart from said first plane and substantially parallel thereto;
    (c) continuously rotating said at least one substrate relative to said plurality of targets;
    (d) sequentially depositing a plurality of layers on said at least one substrate by independent, controlled reactive magnetron sputtering from each said target in a reactive atmosphere to form a composite film, said reactive atmosphere consisting essentially of an inert gas and oxygen and each said target independently controlled; and
    (e) heating said composite film to a temperature sufficient to initiate a solid state reaction to form substantially single phase, homogeneous lead zirconate titanate.

12. The process of claim 11 wherein said substrate is at ambient temperature.

13. The process of claim 11 wherein said inert gas is selected from the group consisting of argon, helium, neon, and krypton.

14. The process of claim 13 wherein said inert gas consists essentially of argon.

15. The process of claim 14 wherein an oxygen pressure of about 5 to 6% of the argon pressure is employed.

16. The process of claim 14 wherein said deposition is carried out at a sputtering pressure ranging from about 8.4 to 9.0 mTorr, with the pressure of argon ranging from about 8.0 to 8.5 mTorr.

17. The process of claim 11 wherein each said target is collimated to provide a substantially perpendicular deposition.

18. The process of claim 11 wherein said at least one substrate is rotated about said axis at a rate of at least 30 rpm.

19. The process of claim 11 wherein said deposition is carried out at a titanium sputtering power ranging from about 60 to 75 watts and a titanium sputtering current ranging from about 0.3 to 0.35 A.

20. The process of claim 11 wherein said deposition is carried out at a zirconium sputtering power ranging from about 20 to 30 watts and a zirconium sputtering current ranging from about 0.15 to 0.2 A.

21. The process of claim 11 wherein said deposition is carried out at a lead sputtering power of about 4 watts and a lead sputtering current of about 0.05 A.

22. The process of claim 11 wherein said composite film is deposited at a rate of about 100 to 120 Å/min.

23. The process of claim 11 wherein said composite film is heated to a temperature of at least about 500° C. to form said lead zirconate titanate.

24. The process of claim 23 wherein said composite film is heated to a temperature of at least about 525° C. to form said lead zirconate titanate.

* * * * *